US012774524B2

(12) United States Patent
Parkhe et al.

(10) Patent No.: US 12,774,524 B2
(45) Date of Patent: Oct. 27, 2026

(54) ELECTROSTATIC CHUCK WITH METAL SHAFT

(71) Applicant: Applied Materials, Inc., Santa Clara, CA (US)

(72) Inventors: Vijay D. Parkhe, San Jose, CA (US); Ashutosh Agarwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 612 days.

(21) Appl. No.: 17/672,520

(22) Filed: Feb. 15, 2022

(65) Prior Publication Data

US 2022/0282371 A1 Sep. 8, 2022

Related U.S. Application Data

(60) Provisional application No. 63/155,964, filed on Mar. 3, 2021.

(51) Int. Cl.

| | |
|---|---|
| ***H01J 37/32*** | (2006.01) |
| ***C23C 16/458*** | (2006.01) |
| ***H10P 72/72*** | (2026.01) |

(52) U.S. Cl.

CPC .... *C23C 16/4586* (2013.01); *H01J 37/32724* (2013.01); *H10P 72/722* (2026.01)

(58) Field of Classification Search

CPC ........... C23C 16/4586; H01J 37/32724; H01L 21/6833; H01L 21/68792; H01L 21/67103; H01L 21/67109; H01L 21/68757; H01L 21/68785

USPC ...................................... 118/728; 156/345.51

See application file for complete search history.

(56) References Cited

U.S. PATENT DOCUMENTS

| | | | | |
|---|---|---|---|---|
| 5,551,983 | A * | 9/1996 | Shepard, Jr. | C23C 16/4584 118/728 |
| 6,129,046 | A * | 10/2000 | Mizuno | C23C 16/4585 118/728 |
| 11,410,869 | B1 * | 8/2022 | Parkhe | H01L 21/67109 |
| 2002/0075624 | A1 | 6/2002 | Wang et al. | |
| 2009/0235866 | A1 | 9/2009 | Kataigi et al. | |

(Continued)

FOREIGN PATENT DOCUMENTS

| | | |
|---|---|---|
| CN | 111052343 A | 4/2020 |
| JP | 2001102436 A | 4/2001 |

(Continued)

OTHER PUBLICATIONS

International Search Report and Written Opinion from Patent Application No. PCT/US2022/017328 dated Jun. 7, 2022, 10 pgs.

(Continued)

*Primary Examiner* — Rudy Zervigon

(74) *Attorney, Agent, or Firm* — Schwabe, Williamson & Wyatt, P.C.

(57) ABSTRACT

Electrostatic chucks (ESCs) for plasma processing chambers, and methods of fabricating ESCs, are described. In an example, a substrate support assembly includes a ceramic bottom plate, a ceramic top plate, and a bond layer between the ceramic top plate and the ceramic bottom plate, the ceramic top plate in direct contact with the bond layer, and the bond layer in direct contact with the ceramic bottom plate. A metal shaft is coupled to the ceramic bottom plate at a side of the ceramic bottom plate opposite the bond layer.

18 Claims, 8 Drawing Sheets

(56) References Cited

U.S. PATENT DOCUMENTS

| | | | | |
|---|---|---|---|---|
| 2012/0285658 | A1* | 11/2012 | Roy | H01L 21/68785 165/47 |
| 2016/0099162 | A1* | 4/2016 | Ng | H01J 37/32642 269/302 |
| 2016/0111315 | A1* | 4/2016 | Parkhe | H01L 21/67109 361/234 |
| 2016/0225651 | A1* | 8/2016 | Tran | H01L 21/67103 |
| 2017/0069519 | A1 | 3/2017 | Shiraiwa | |
| 2018/0047606 | A1* | 2/2018 | Kin | H01L 21/67103 |
| 2021/0238741 | A1* | 8/2021 | Wu | H01J 37/32449 |

FOREIGN PATENT DOCUMENTS

| | | | |
|---|---|---|---|
| JP | 2003158172 | A | 5/2003 |
| JP | 2009256789 | A | 11/2009 |
| JP | 2017538278 | A | 12/2017 |
| JP | 202021958 | A | 2/2020 |
| KR | 1020170028248 | | 3/2017 |
| WO | 2019231614 | A1 | 12/2019 |
| WO | 2020195930 | A1 | 10/2020 |

OTHER PUBLICATIONS

Preliminary Rejection for Korean Patent Application No. 10-2023-7033227, dated Nov. 20, 2024, 11 pages.

Notice of Reasons for Rejection for Japanese Patent Application No. 2023-553202, dated Nov. 19, 2024, 11 pages.

Notice of Allowance from Korean Patent Application No. 10-2023-7033227 dated Jul. 10, 2025, 4 pgs.

Official Letter from Taiwan Patent Application No. 111107250 dated May 8, 2025, 17 pgs.

* cited by examiner

ELECTROSTATIC CHUCK WITH METAL SHAFT

CROSS-REFERENCE TO RELATED APPLICATIONS

This application claims the benefit of U.S. Provisional Application No. 63/155,964, filed on Mar. 3, 2021, the entire contents of which are hereby incorporated by reference herein.

BACKGROUND

1) Field

Embodiments of the present disclosure pertain to the field of reactor or plasma processing chambers and, in particular, to electrostatic chucks with metal shafts.

2) Description of Related Art

Processing systems such as reactors or plasma reactors are used to form devices on a substrate, such as a semiconductor wafer or a transparent substrate. Often the substrate is held to a support for processing. The substrate may be held to the support by vacuum, gravity, electrostatic forces, or by other suitable techniques. During processing, the precursor gas or gas mixture in the chamber is energized (e.g., excited) into a plasma by applying a power, such as a radio frequency (RF) power, to an electrode in the chamber from one or more power sources coupled to the electrode. The excited gas or gas mixture reacts to form a layer of material on a surface of the substrate. The layer may be, for example, a passivation layer, a gate insulator, a buffer layer, and/or an etch stop layer.

In the semiconductor and other industries, electrostatic chucks (ESC) are used to hold a workpiece such as substrates on supports during processing of the substrate. A typical ESC may include a base, an electrically insulative layer disposed on the base, and one or more electrodes embedded in the electrically insulative layer. The ESC may be provided with an embedded electric heater, as well as be fluidly coupled to a source of heat transfer gas for controlling substrate temperature during processing. During use, the ESC is secured to the support in a process chamber. The electrode in the ESC is electrically biased with respect to a substrate disposed on the ESC by an electrical voltage source. Opposing electrostatic charges accumulate in the electrode of the ESC and on the surface of the substrate, the insulative layer precluding flow of charge therebetween. The electrostatic force resulting from the accumulation of electrostatic charge holds the substrate to the ESC during processing of the substrate.

SUMMARY

Embodiments of the present disclosure include electrostatic chucks (ESCs) for plasma processing chambers, and methods of fabricating ESCs.

In an embodiment, a substrate support assembly includes a ceramic bottom plate, a ceramic top plate, and a bond layer between the ceramic top plate and the ceramic bottom plate, the ceramic top plate in direct contact with the bond layer, and the bond layer in direct contact with the ceramic bottom plate. A metal shaft is coupled to the ceramic bottom plate at a side of the ceramic bottom plate opposite the bond layer.

DETAILED DESCRIPTION

Electrostatic chucks (ESCs) for plasma processing chambers, and methods of fabricating ESCs, are described. In the following description, numerous specific details are set forth, such as electrostatic chuck components and material regimes, in order to provide a thorough understanding of embodiments of the present disclosure. It will be apparent to one skilled in the art that embodiments of the present disclosure may be practiced without these specific details. In other instances, well-known aspects, such as plasma enhanced chemical vapor deposition (PECVD) or plasma enhanced atomic layer deposition (PEALD) processes, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed to a bolted shaft metal bonded edge purge electrostatic chuck. Embodiments can be implemented to fabricate an ESC with a separate shaft.

In accordance with one or more embodiments of the present disclosure, inserts are included inside ceramic portions of an ESC to hold a clamp ring and shaft. The shaft and ceramic plate are separate. Embodiments can be implemented to provide a metal shaft with a ceramic plate. Embodiments can be implemented to address cost and/or the need for edge purge. Particular embodiments can include a ceramic (such as a metal oxide or metal nitride) for use as an ESC on top of a metal shaft separated with one or more O-rings. A temperature range of the ESC can be adjusted by changing properties of the top plate. The top plate can be configured to hold a clamp ring on a top thereof.

In an embodiment, a ceramic part is made separate in two parts and then metal bonded with inserts inside and then attached to a shaft and clamp ring. In one embodiment, an edge ring is bolted to an insert. In a particular embodiment, the use of three locator pins is implemented to precisely maintain the position on top of the ESC. A cover ring of ceramic or metal can be used on top of the ESC. In one embodiment, the ring creates gap so gas is purged to the back edge of the ESC and is bolted to the insert and aligned with the three precise pins.

Figure 1A:
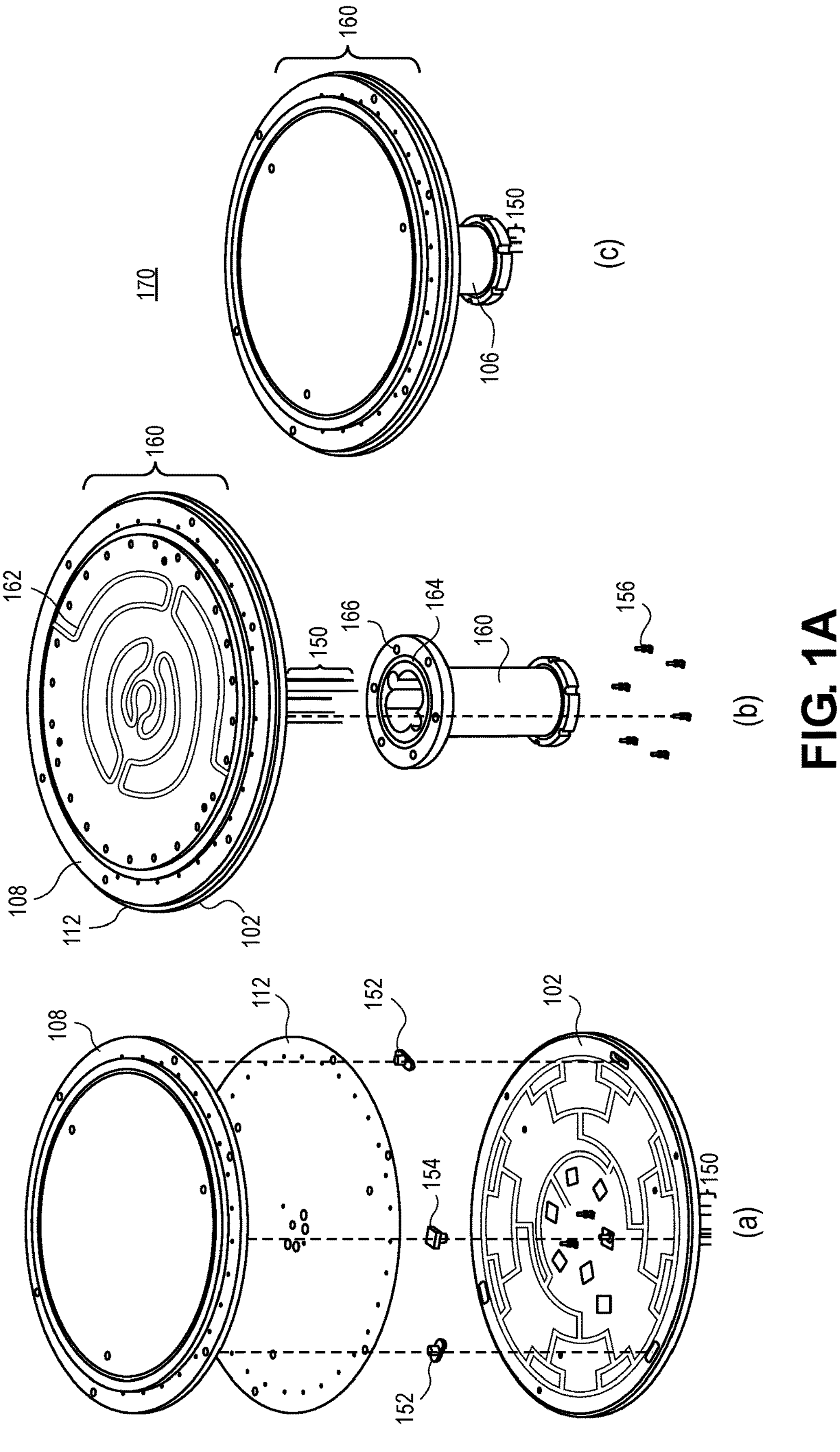
FIG. 1A illustrates a process for fabricating an electrostatic chuck (ESC), in accordance with an embodiment of the present disclosure.

As an exemplary fabrication scheme, FIG. 1A illustrates a process for fabricating an electrostatic chuck (ESC), in accordance with an embodiment of the present disclosure.

Referring to part (a) of FIG. 1A, fabrication of a substrate support assembly includes coupling a ceramic bottom plate 102 (which can be a groove plate and can include a heater) and a ceramic top plate 108 (which can include a heater) with a bond layer 112. In one embodiment, the bond layer 112 is a metal layer between the ceramic top plate 108 and the ceramic bottom plate 102, the ceramic top plate 108 in direct contact with the bond layer 112, and the bond layer 112 in direct contact with the ceramic bottom plate 102. Inserts 152 and 154 can be included within the ceramic bottom plate 102, the ceramic top plate 108, and the bond layer 112. The ceramic bottom plate 102 can include facilities lines 150 coupled to a bottom surface thereof.

Referring to part (b) of FIG. 1A, a metal shaft 106 is coupled to an assembly 160 by the ceramic bottom plate 102 at a side of the ceramic bottom plate 102 opposite the bond layer 112. It is also to be appreciated that the ceramic top plate may include other features 162, such as top grooves (or channels) for accommodating cooling gas flow which match through passage for gas in bond layer and top ceramic so gas is delivered behind wafer or for edge purge. The metal shaft 106 can include an O-ring 164 and openings 166 to accommodate bolts 156. Referring to part (c) of FIG. 1A, an ESC 170 results from the coupling of part (b) of FIG. 1A.

Figure 1B:
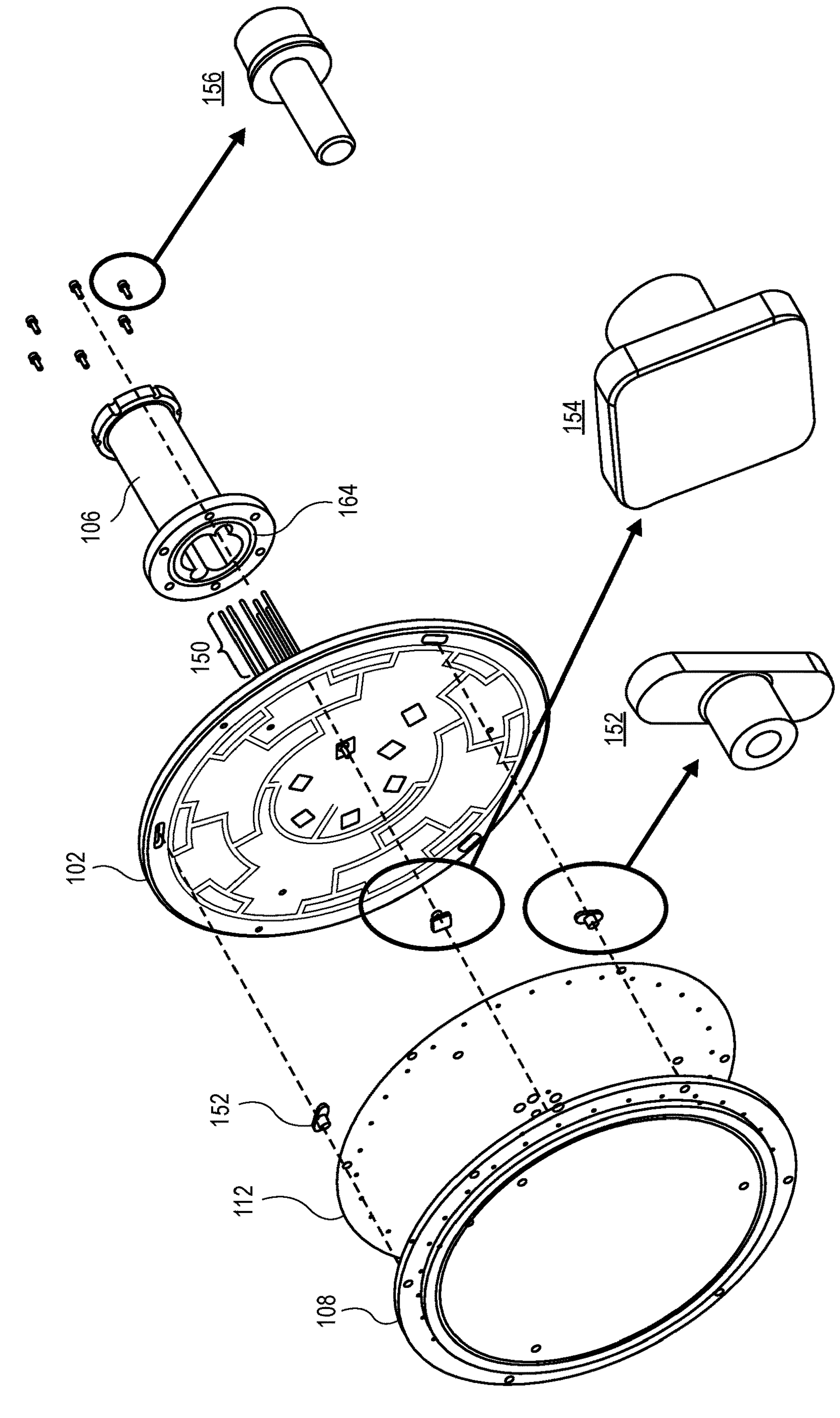
FIG. 1B illustrates an expanded view of components of an electrostatic chuck (ESC), in accordance with an embodiment of the present disclosure.

As an exemplary structure, FIG. 1B illustrates an expanded view of components of an electrostatic chuck (ESC), in accordance with an embodiment of the present disclosure.

Referring to FIG. 1B, the structures of FIG. 1A are shown relative to one another. Expanded views of inserts 152 and 154 and bolts 156 are depicted. The inserts 152 can be a helicoil configured to hold a clamp ring or cover ring. The inserts 154 can be a helicoil configured to hold shaft 106 to the bottom plate 102, e.g., by bolts 156.

Figure 2A:
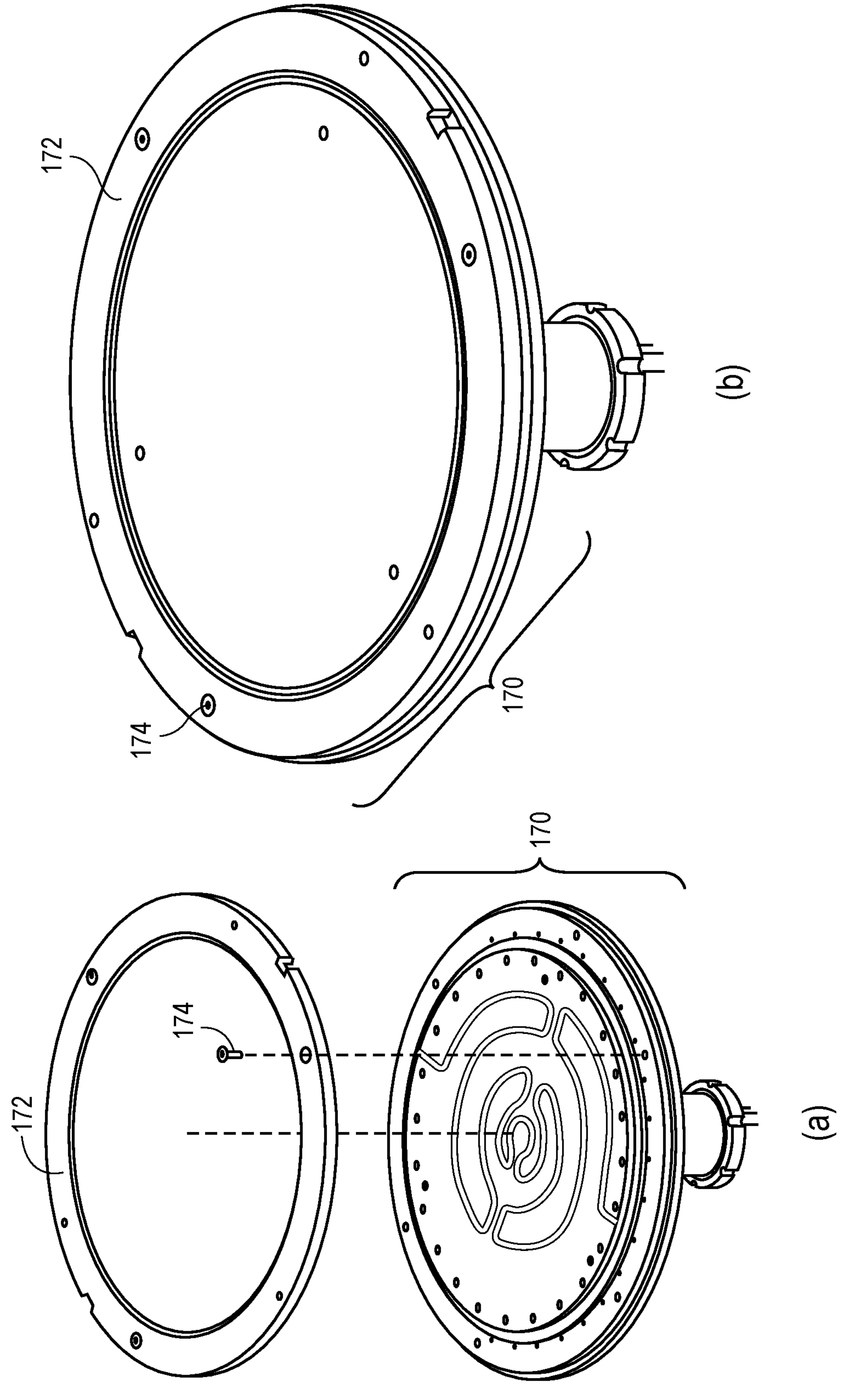
FIG. 2A illustrates a process for fabricating an electrostatic chuck (ESC), in accordance with an embodiment of the present disclosure.

As an exemplary fabrication scheme, FIG. 2A illustrates a process for fabricating an electrostatic chuck (ESC), in accordance with an embodiment of the present disclosure.

Referring to part (a) of FIG. 2A, a clamp ring, cover ring or edge ring 172 is provided above the structure 170 of FIG. 1A. Bolts 174 are used to couple the clamp ring, cover ring or edge ring 172 to the structure 170 to form an ESC.

Figure 2B:
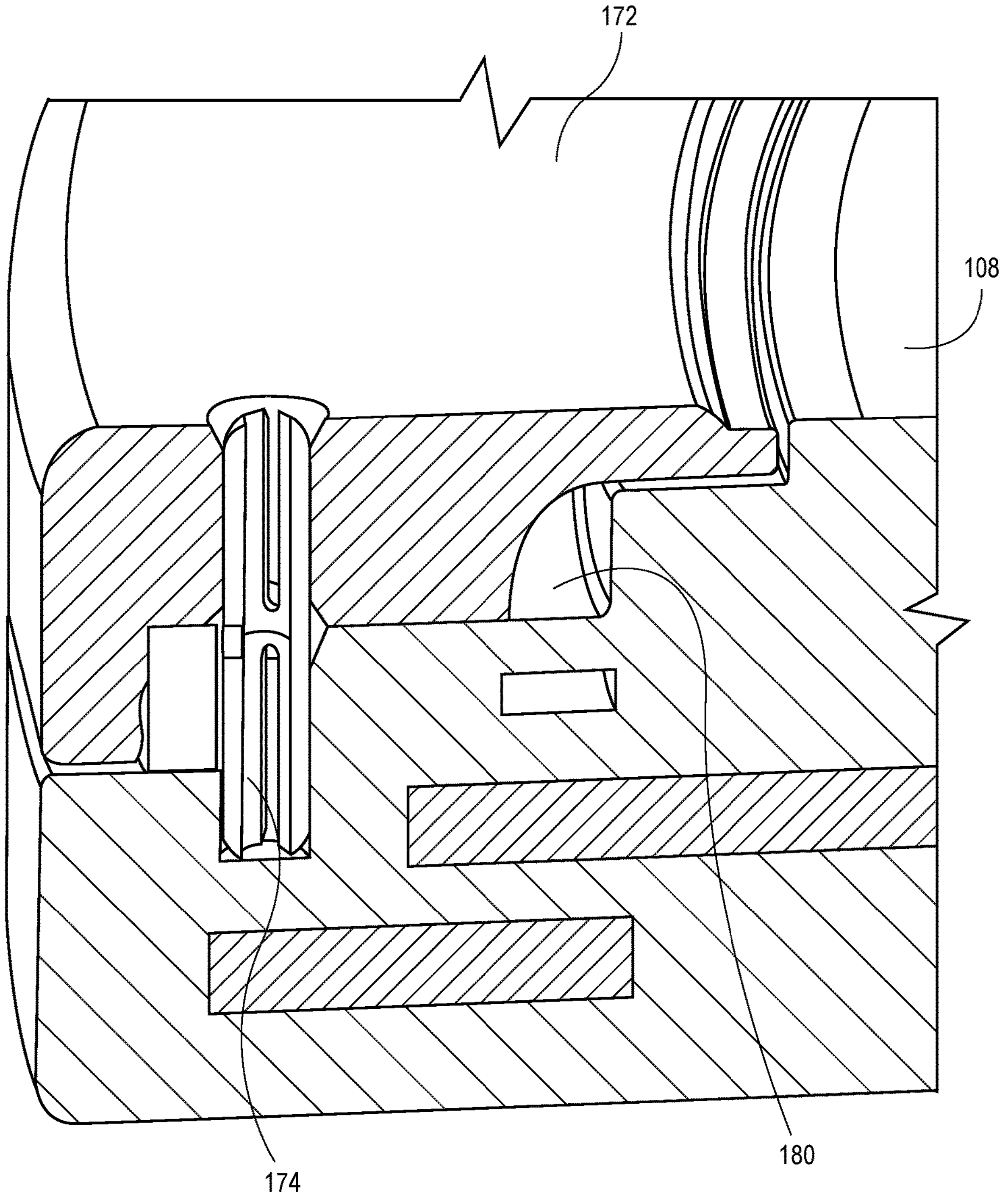
FIG. 2B illustrates a cross-sectional view of a portion of an electrostatic chuck (ESC) including a covering ring on a top ceramic plate, in accordance with an embodiment of the present disclosure.

As an exemplary fabrication scheme, FIG. 2B illustrates a cross-sectional view of a portion of an electrostatic chuck (ESC) including a covering ring on a top ceramic plate, in accordance with an embodiment of the present disclosure.

Referring to FIG. 2B, clamp ring, cover ring or edge ring 172 provides a gap 180 between the clamp ring, cover ring or edge ring 172 and the ceramic top plate 108. The gap 180 can enable edge purge of a substrate supported by the electrostatic chuck.

To provide further context, generally, diffusion bonding is a costly process and heating to such high temperatures affects thermal and/or electrical properties of ceramics. State-of-the-art ESCs are typically fabricated with two diffusion bonds: a first diffusion bond between a top plate and a bottom plate, and a second diffusion bond between the bonded plates and a shaft. It is to be appreciated that the use of too many diffusion bonds formed at high temperature can affect ceramic resistivity. Embodiments described herein can be implemented to eliminate the need for diffusion bonding. Embodiments can be implemented to ensure that a top plate does not change (or only minimally changes) resistivity during fabrication of an ESC. Embodiments may be implemented to advantageously reduce the cost of ESC fabrication since at least one high temperature operation is removed from the fabrication scheme. Embodiments can be implemented to preserve or retain an as-sintered resistivity of a top ceramic material.

Advantages to implementing one or more embodiments described herein can include use of a low cost metal shaft in place of a high cost ceramic shaft. Embodiments can enable fabrication of an ESC without resistivity change. Advantages can include reduced fabrication cost for an ESC. Advantages can include enabling the possibility of fabricating an ESCs to maintain the electrical properties of the components included in the ESC.

In comparison to state-of-the-art approaches which can include two diffusion bonds, in accordance with an embodiment of the present disclosure, an aluminum bond is used in place of one of the typical diffusion bonds. For example, an aluminum bond can be used between a top plate and a bottom plate. A metal shaft with an O-ring can be used to replace a ceramic bond between a ceramic shaft and a ceramic bottom plate.

Figure 3:
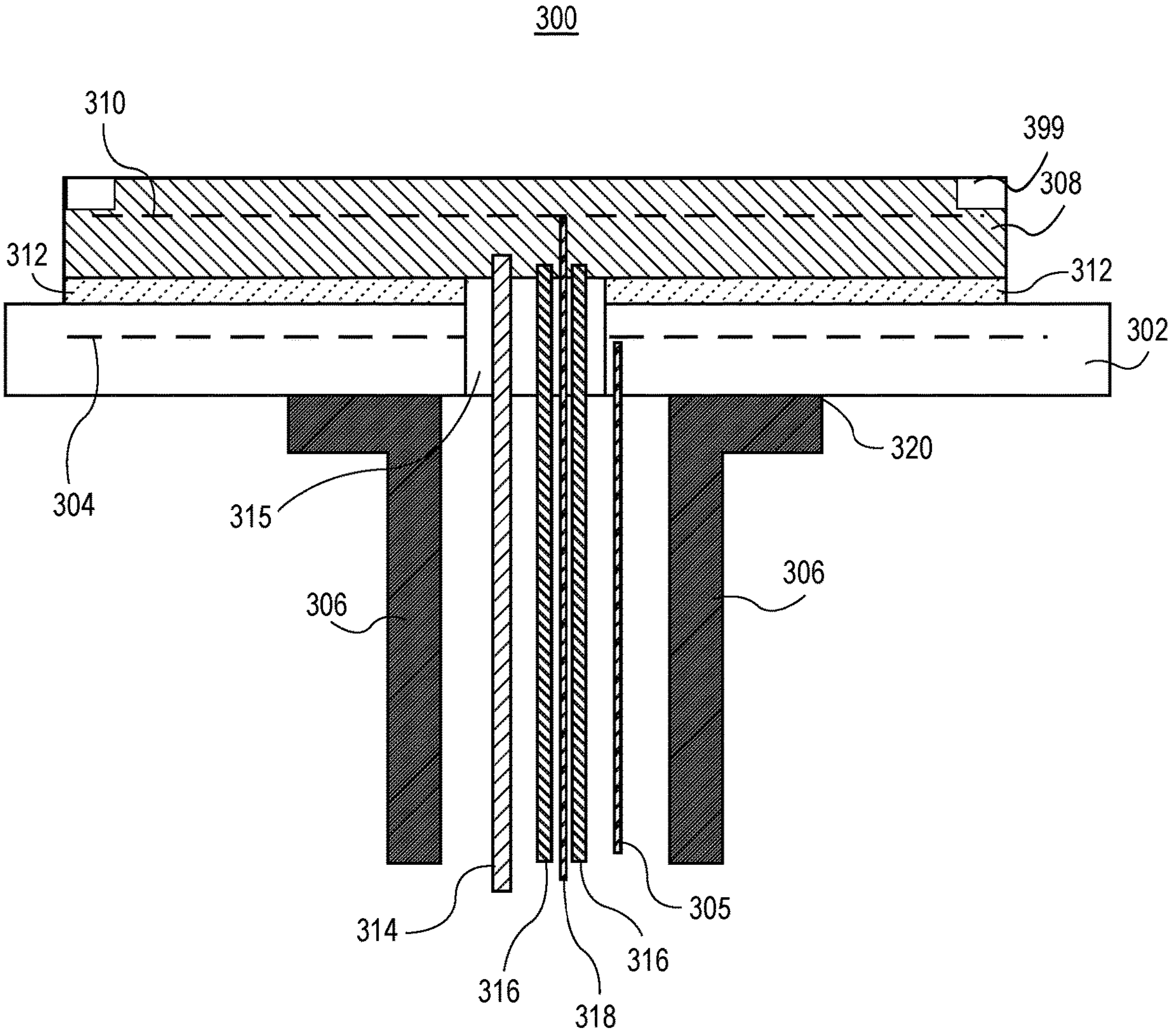
FIG. 3 illustrates a cross-sectional view of an electrostatic chuck (ESC), in accordance with an embodiment of the present disclosure.

Shown more generically, as an exemplary fabricated ESC, FIG. 3 illustrates a cross-sectional view of an electrostatic chuck (ESC), in accordance with an embodiment of the present disclosure.

Referring to FIG. 3, an ESC 300 includes a ceramic bottom plate 302 having heater coils 304 therein. The heater coils 304 can be coupled to a heater connection 305 (it is to be appreciated that in another embodiment, a heater electrode is screen printed in case of tape casted AlN or AlN plate material used for the ESC fabrication). A metal shaft 306 is coupled to a bottom surface of the ceramic bottom plate 302. An O-ring may be included between the metal shaft 306 and the bottom surface of the ceramic bottom plate 302. The ESC 300 also includes a ceramic top plate 308. The ceramic top plate 308 has an ESC (clamping) electrode 310 or electrode assembly therein. A metal layer 312 bonds the ceramic top plate 308 to a top surface of the ceramic bottom plate 302. A thermocouple 314 extends through an opening 315 in the ceramic bottom plate 302 and in metal layer 312. A high voltage insulation 316 extends through the opening 315 in the ceramic bottom plate 302 and in metal layer 312 and houses an ESC high voltage connection 318. A cover ring 399 can be coupled to the ceramic top plate 308, such as described in association with FIGS. 2A-2B.

With reference again to FIG. 3, in accordance with an embodiment of the present disclosure, a substrate support assembly 300 includes a ceramic bottom plate 302 having heater elements 304 therein. The substrate support assembly 300 also includes a ceramic top plate 308 having an electrode 310 therein. A metal layer 312 is between the ceramic top plate 308 and the ceramic bottom plate 302. The ceramic top plate 308 is in direct contact with the metal layer 312, and the metal layer 312 is in direct contact with the ceramic bottom plate 302.

In an embodiment, metal layer 312 provides for the incorporation of a metal bond in place of a ceramic to ceramic diffusion bond that can otherwise change a resistivity of a top ceramic during diffusion bond formation. In one embodiment, metal layer 312 is a metal foil, such as an aluminum foil. In one such embodiment, metal layer 312 is an aluminum foil impregnated with about 2% to 20% Si (e.g., as atomic % of total foil composition), with the remainder being aluminum or essentially all aluminum (i.e., the aluminum foil includes silicon having an atomic concentration in the range of 2%-20% of the aluminum foil). In an embodiment, metal layer 312 is pre-patterned, e.g., to include opening 315 and/or additional openings to accommodate lift pins, etc. In one embodiment, the metal layer 312 is an aluminum foil having a thickness in the range of 50-500 microns, and may be about 250 microns. In an embodiment, the metal layer 312 is an aluminum foil and is cleaned prior to inclusion in an ESC manufacturing process, e.g., to remove a passivation layer prior to bonding. In an embodiment, metal layer 312 is an aluminum foil and can sustain corrosive processes such as chlorine based process without etch or degradation of the metal layer 312 when the ESC is in use. However, if used for non-chlorine based processes, metal layer 312 may be composed of silver copper alloy, with or without addition of titanium, for example. In an embodiment, metal layer 312 is bonded to top plate 308 and bottom plate 302 at a temperature less than 600 degrees Celsius and, more particularly, less than 300 degrees Celsius. It is to be appreciated that higher ESC usage temperatures such as 650 degrees Celsius can be used if metal bonding is performed with a high temperature metal bond such as silver copper or gold nickel temperatures much lower than 1400 degrees Celsius but much above a 650 degrees Celsius usage temperature.

With reference to ceramic top plate 308 having the ESC (clamping) electrode 310 therein, in an embodiment, a body of the top plate may be formed by sintering a ceramic material, such as aluminum nitride (AlN) or aluminum oxide powder or other suitable material. An RF mesh can be embedded in the body. The RF mesh can have electrical connections extending through a bottom surface of the body. The RF mesh may include molybdenum or another suitable metal material mesh. In one embodiment, the mesh is an about 125 micron diameter mesh. The materials can be sintered to form a unitary structure. In one embodiment, the electrode 310 is fabricated from a metallic material, for example molybdenum, which may have a coefficient of thermal expansion similar to the body. In an embodiment, the ceramic top plate 308 is targeted for sustaining temperatures below 350 degrees Celsius, e.g., between 150-300 degrees Celsius, and may include dopants for optimizing such a targeted temperature range operation.

A clamping electrode 310 can include at least first and second electrodes. During operation, a negative charge may be applied to the first electrode and a positive charge may be applied to the second electrode, or vice versa, to generate an electrostatic force. During chucking, the electrostatic force generated from the electrodes holds a substrate disposed thereon in a secured position. As a power supplied from a power source is turned off, the charges present in an interface between the electrodes may be maintained over a long period of time. To release the substrate held on the electrostatic chuck, a short pulse of power in the opposite polarity may be provided to the electrodes to remove the charge present in the interface.

An electrode assembly may be formed by metallic bars, sheet, sticks, foil, and may be pre-molded, pre-casted and pre-manufactured and placed onto a surface of an insulating base during fabrication of the electrostatic chuck. Alternatively, a metal deposition process may be performed to deposit and form the electrode assembly directly on a top surface of an insulating base. Suitable deposition process may include PVD, CVD, plating, ink jet printing, rubber stamping, screen printing or aerosol print process. Additionally, metal paste/metal lines may be formed on a top surface of an insulating base. The metal paste/metal lines may initially be a liquid, paste or metal gel that may be patterned on to the object surface in a pattern to form electrode fingers with different configurations or dimensions on the top surface of the insulating base.

Ceramic top plate 308 or ceramic bottom plate 302 may include, but is not limited to, aluminum nitride, glass, silicon carbide, aluminum oxide, yttrium containing materials, yttrium oxide ($Y_2O_3$), yttrium-aluminum-garnet (YAG), titanium oxide (TiO), or titanium nitride (TiN). With reference to ceramic bottom plate 302, in an embodiment, the ceramic bottom plate 308 is targeted for sustaining temperatures up to 650 degrees Celsius, and may include dopants for optimizing such a targeted temperature range operation. In one embodiment, the ceramic bottom plate 302 has a different aluminum nitride composition than an aluminum nitride composition of the ceramic top plate 308. Heating elements 304 included in the ceramic bottom plate 302 may use any suitable heating techniques, such as resistive heating or inductive heating. The heating elements 304 may be composed of a resistive metal, a resistive metal alloy, or a combination of the two. Suitable materials for the heating elements may include those with high thermal resistance, such as tungsten, molybdenum, titanium, or the like. In one embodiment, heating elements 304 are composed of a molybdenum wire. The heating elements 304 may also be fabricated with a material having thermal properties, e.g., coefficient of thermal expansion, substantially matching at least one or both the aluminum nitride body to reduce stress caused by mismatched thermal expansion.

In an embodiment, ceramic top plate 308 is fabricated and then bonded to the ceramic bottom plate by the metal layer 312 (which may already include one or more openings patterned therein). In an embodiment, the metal layer 312 is bonded to the ceramic top plate 308 at the same time as the metal layer 312 is bonded to ceramic bottom plate 302. In another embodiment, the metal layer 312 is first bonded to the ceramic top plate 308 and then the ceramic top plate/metal layer 312 pairing is bonded to ceramic bottom plate 302. In another embodiment, the metal layer 312 is first bonded to the ceramic bottom plate 302 and then the ceramic bottom plate/metal layer 312 pairing is bonded to ceramic top plate 308. In any case, in one particular embodiment, the ceramic top plate is formed from aluminum nitride (AlN) or aluminum oxide ($Al_2O_3$) powder and a metal mesh which are sintered.

In an embodiment, bonding the ceramic top plate 308 to the ceramic bottom plate 302 with the metal layer 312 includes heating the ceramic bottom plate 302, the metal layer 312, and the ceramic top plate 308 to a temperature less than 600 degrees Celsius. In an embodiment, the metal layer 312 is an aluminum foil, and the method includes cleaning a surface of the aluminum foil to remove a passivation layer of the aluminum foil prior to bonding the ceramic top plate 308 to the ceramic bottom plate 302 with the metal layer 312.

Figure 4:
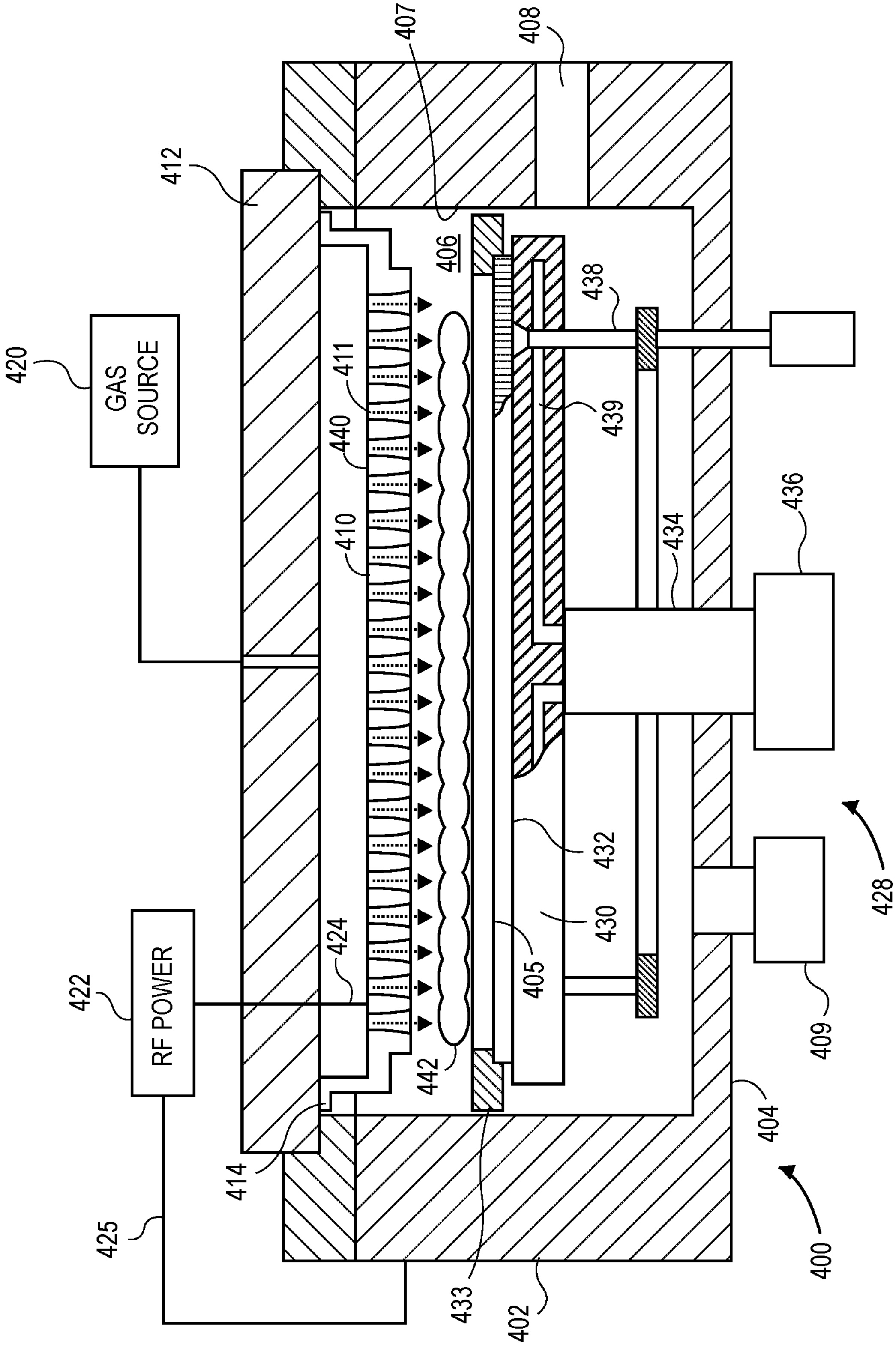
FIG. 4 is a schematic cross-sectional view of a process chamber including a substrate support assembly, in accordance with an embodiment of the present disclosure.

In another aspect, FIG. 4 is a schematic cross-sectional view of a process chamber 400 including a substrate support assembly 428, in accordance with an embodiment of the present disclosure. In the example of FIG. 4, the process chamber 400 is a plasma enhanced chemical vapor deposition (PECVD) chamber. As shown in FIG. 4, the process chamber 400 includes one or more sidewalls 402, a bottom 404, a gas distribution plate 410, and a cover plate 412. The sidewalls 402, bottom 404, and cover plate 412, collectively define a processing volume 406. The gas distribution plate 410 and substrate support assembly 428 are disposed in the processing volume 406. The processing volume 406 is accessed through a sealable slit valve opening 408 formed through the sidewalls 402 such that a substrate 405 may be transferred in and out of the process chamber 400. A vacuum pump 409 is coupled to the chamber 400 to control the pressure within the processing volume 406.

The gas distribution plate 410 is coupled to the cover plate 412 at its periphery. A gas source 420 is coupled to the cover plate 412 to provide one or more gases through the cover plate 412 to a plurality of gas passages 411 formed in the gas distribution plate 410. The gases flow through the gas passages 411 and into the processing volume 406 toward the substrate receiving surface 432.

An RF power source 422 is coupled to the cover plate 412 and/or directly to the gas distribution plate 410 by an RF power feed 424 to provide RF power to the gas distribution plate 410. Various RF frequencies may be used. For example, the frequency may be between about 0.3 MHz and about 200 MHz, such as about 13.56 MHz. An RF return path 425 couples the substrate support assembly 428 through the sidewall 402 to the RF power source 422. The RF power source 422 generates an electric field between the gas distribution plate 410 and the substrate support assembly 428. The electric field forms a plasma from the gases present between the gas distribution plate 410 and the substrate support assembly 428. The RF return path 425 completes the electrical circuit for the RF energy that prevents stray plasma from causing RF arcing due to a voltage differential between the substrate support assembly 428 and the sidewall 402. Thus the RF return path 425 mitigates arcing which causes process drift, particle contamination and damage to chamber components.

The substrate support assembly 428 includes a substrate support 430 and a stem 434. The stem 434 is coupled to a lift system 436 that is adapted to raise and lower the substrate support assembly 428. The substrate support 430 includes a substrate receiving surface 432 for supporting the substrate 405 during processing. Lift pins 438 are moveably disposed through the substrate support 430 to move the substrate 405 to and from the substrate receiving surface 432 to facilitate substrate transfer. An actuator 414 is utilized to extend and retract the lift pins 438. A ring assembly 433 may be placed over periphery of the substrate 405 during processing. The ring assembly 433 is configured to prevent or reduce unwanted deposition from occurring on surfaces of the substrate support 430 that are not covered by the substrate 405 during processing.

The substrate support 430 may also include heating and/or cooling elements 439 to maintain the substrate support 430 and substrate 405 positioned thereon at a desired temperature. In one embodiment, the heating and/or cooling elements 439 may be utilized to maintain the temperature of the substrate support 430 and substrate 405 disposed thereon during processing to less than about 800 degrees Celsius. In one embodiment, the heating and/or cooling elements 439 may be used to control the substrate temperature to less than 650 degrees Celsius, such as between 300 degrees Celsius and about 400 degrees Celsius. In an embodiment, the substrate support 430/substrate support assembly 428 is as described above in association with FIGS. 1A-1B, 2A-2B and 3.

Figure 5:
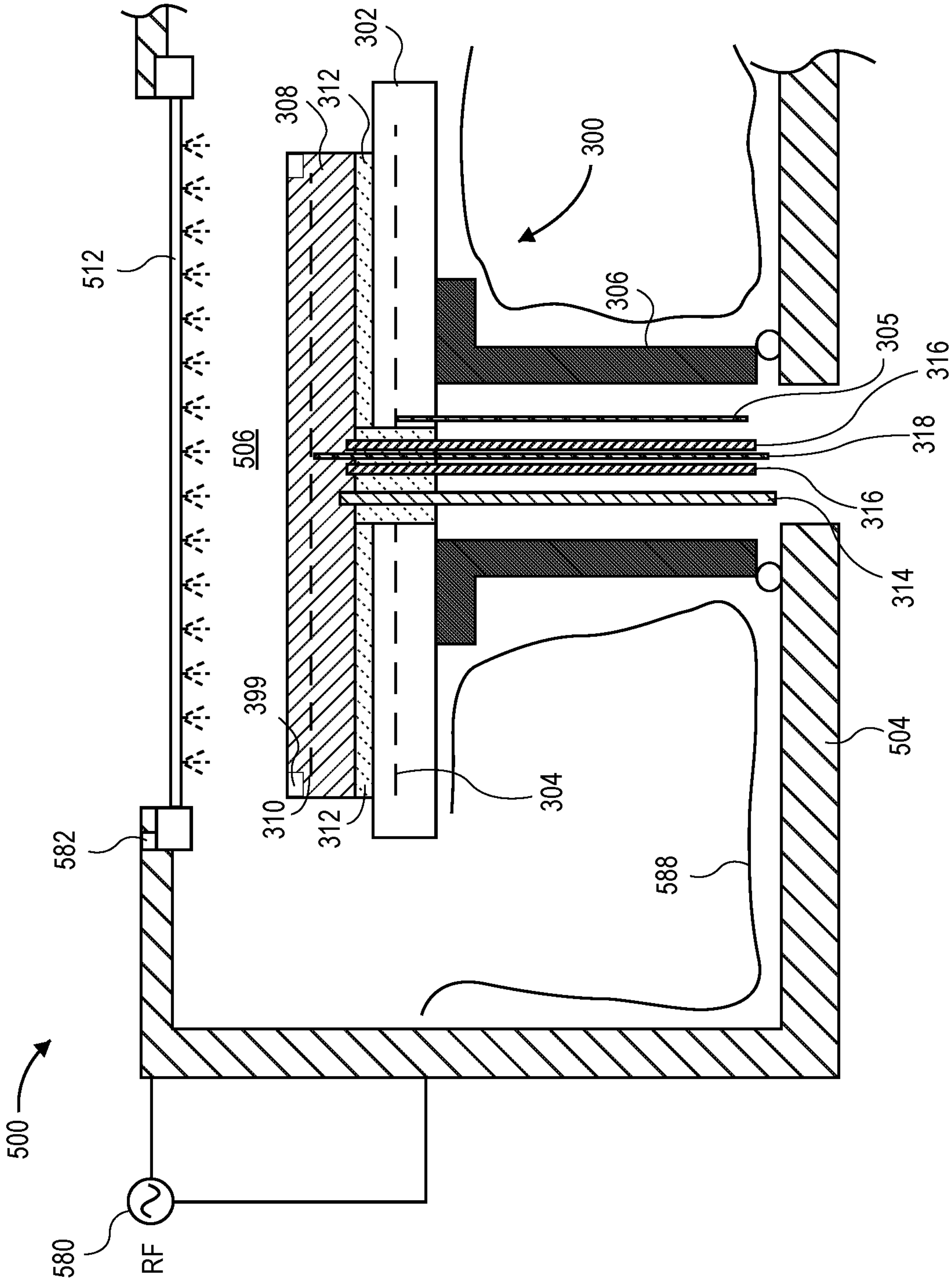
FIG. 5 is a partial schematic cross-sectional view of a processing chamber including a substrate support assembly, in accordance with an embodiment of the present disclosure.

In another aspect, FIG. 5 is a partial schematic cross-sectional view of a processing chamber 500 including the substrate support assembly 300, in accordance with an embodiment of the present disclosure. The processing chamber 500 has a body. The body has sidewalls, a bottom 504 and a showerhead 512. The sidewalls, bottom 504 and showerhead 512 define an interior volume 506. In an embodiment, a substrate support assembly 300, such as described in association with FIGS. 1A-1B, 2A-2B, 3, is disposed within the interior volume 506. A RF generator 580 may be coupled to an electrode 582 in the showerhead 512. The RF generator 580 may have an associated RF return path 588 for completing the RF circuit when plasma is present. Advantageously, an RF ground path for maintaining the plasma can be maintained and provide a long service life for the substrate support assembly 300.

In an embodiment, a semiconductor wafer or substrate supported by substrate support assembly 300 is composed of a material suitable to withstand a fabrication process and upon which semiconductor processing layers may suitably be disposed. For example, in one embodiment, a semiconductor wafer or substrate is composed of a group IV-based material such as, but not limited to, crystalline silicon, germanium or silicon/germanium. In a specific embodiment, the semiconductor wafer is a monocrystalline silicon substrate. In a particular embodiment, the monocrystalline silicon substrate is doped with impurity atoms. In another embodiment, the semiconductor wafer or substrate is composed of a III-V material.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process chamber 400 and substrate support assembly 428 described above in association with FIG. 4 or with processing chamber 500 and substrate support assembly 300 described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
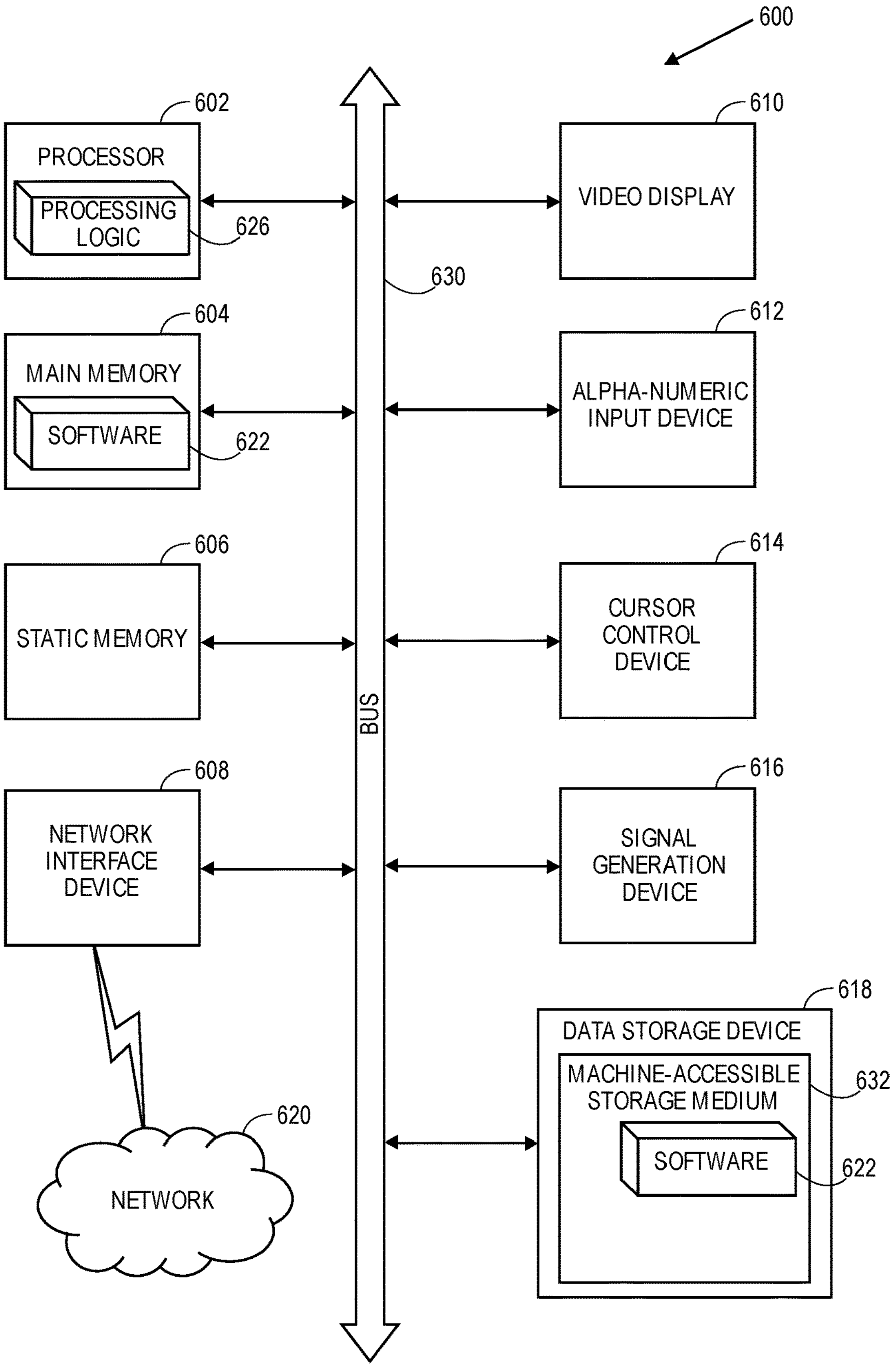
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

Thus, electrostatic chucks (ESCs) for plasma processing chambers, and methods of fabricating ESCs, have been disclosed.

What is claimed is:

1. A substrate support assembly, comprising:
- a ceramic bottom plate;
- a ceramic top plate;
- a bond layer between the ceramic top plate and the ceramic bottom plate, the ceramic top plate in direct contact with the bond layer, and the bond layer in direct contact with the ceramic bottom plate;
- a metal shaft in direct contact with a surface of the ceramic bottom plate, the surface of the ceramic bottom plate opposite the bond layer; and
- a metal cover ring on the ceramic top plate, the metal cover ring having an outer perimeter within a perimeter of the ceramic top plate from a plan view perspective, and the metal cover ring bolted to the ceramic top plate.

2. The substrate support assembly of claim 1, wherein the ceramic bottom plate has heater elements therein, and the ceramic top plate has an electrode therein.

3. The substrate support assembly of claim 1, wherein the ceramic top plate has heater elements and an electrode therein.

4. The substrate support assembly of claim 1, wherein the ceramic bottom plate includes gas grooves in a top surface thereof.

5. The substrate support assembly of claim 1, wherein the ceramic top plate includes gas grooves.

6. The substrate support assembly of claim 1, further comprising:
- an O-ring between the metal shaft and the ceramic bottom plate.

7. The substrate support assembly of claim 1, wherein the bond layer is an aluminum foil.

8. The substrate support assembly of claim 7, wherein the aluminum foil comprises silicon having an atomic concentration in the range of 2%-20% of the aluminum foil.

9. The substrate support assembly of claim 7, wherein the aluminum foil has a thickness in the range of 50-500 microns.

10. A system, comprising:
- a chamber;
- a plasma source within or coupled to the chamber; and
- an electrostatic chuck within the chamber, the electrostatic chuck comprising:
  - a ceramic bottom plate;
  - a ceramic top plate;
  - a bond layer between the ceramic top plate and the ceramic bottom plate, the ceramic top plate in direct contact with the bond layer, and the bond layer in direct contact with the ceramic bottom plate;
  - a metal shaft in direct contact with a surface of the ceramic bottom plate, the surface of the ceramic bottom plate opposite the bond layer; and
  - a metal cover ring on the ceramic top plate, the metal cover ring having an outer perimeter within a perimeter of the ceramic top plate from a plan view perspective, and the metal cover ring bolted to the ceramic top plate.

11. The system of claim 10, wherein the ceramic bottom plate of the electrostatic chuck has heater elements therein, and the ceramic top plate has an electrode therein.

12. The system of claim 10, wherein the ceramic top plate of the electrostatic chuck has heater elements and an electrode therein.

13. The system of claim 10, wherein the ceramic bottom plate of the electrostatic chuck includes gas grooves in a top surface thereof.

14. The system of claim 10, wherein the ceramic top plate of the electrostatic chuck includes gas grooves.

15. The system of claim 10, the electrostatic chuck further comprising:
- an O-ring between the metal shaft and the ceramic bottom plate.

16. The system of claim 10, wherein the bond layer of the electrostatic chuck is an aluminum foil.

17. The system of claim 16, wherein the aluminum foil comprises silicon having an atomic concentration in the range of 2%-20% of the aluminum foil.

18. The system of claim 16, wherein the aluminum foil has a thickness in the range of 50-500 microns.

* * * * *